(12) United States Patent
Moon et al.

(10) Patent No.: US 7,514,203 B2
(45) Date of Patent: Apr. 7, 2009

(54) POSITIVE PHOTORESIST COMPOSITION

(75) Inventors: Bong-Seok Moon, Daejeon (KR); Hyo-Jeong Kim, Jeollabuk-do (KR); Jin-Gon Kim, Chungcheongbuk-do (KR); Yang-Hyun Yoo, Jeollabuk-do (KR); Min-Ji Kim, Daejeon (KR); Mi-Kyeong Jeong, Chungcheongnam-do (KR); Kwon-Yil Yoo, Jeollabuk-do (KR); Nak-Chil Jung, Gyeonggi-do (KR); Seon-Ho Kim, Seoul (KR)

(73) Assignee: Samyangems Co., Ltd. (KR)

( * ) Notice: Subject to any disclaimer, the term of this patent is extended or adjusted under 35 U.S.C. 154(b) by 37 days.

(21) Appl. No.: 11/884,185

(22) PCT Filed: Dec. 21, 2005

(86) PCT No.: PCT/KR2005/004434

§ 371 (c)(1),
(2), (4) Date: Aug. 9, 2007

(87) PCT Pub. No.: WO2007/069798

PCT Pub. Date: Jun. 21, 2007

(65) Prior Publication Data

US 2008/0166656 A1 Jul. 10, 2008

(30) Foreign Application Priority Data

Dec. 16, 2005 (KR) ............... 10-2005-0124775

(51) Int. Cl.
*G03C 1/73* (2006.01)
*G03F 7/039* (2006.01)

(52) U.S. Cl. ............... 430/270.1; 430/280.1; 430/326; 430/905; 430/910; 430/914

(58) Field of Classification Search ............... None
See application file for complete search history.

(56) References Cited

U.S. PATENT DOCUMENTS 5,059,513 A * 10/1991 Hopf et al. ............... 430/326

FOREIGN PATENT DOCUMENTS

| JP | 2-146045 | 6/1990 |
| JP | 3-200968 | 9/1991 |
| JP | 6-35199 | 2/1994 |
| JP | 10-69084 | 3/1998 |

* cited by examiner

*Primary Examiner*—Sin J. Lee
(74) *Attorney, Agent, or Firm*—Hamilton, Brook, Smith & Reynolds, P.C.

(57) ABSTRACT

Disclosed is a positive photoresist composition used for a liquid crystal display. The positive photoresist composition of the present invention includes 3 to 50% by weight of binder resin having a certain structure, 2 to 40% by weight of a photoactive compound and 10 to 94% by weight of an organic solvent. The positive photoresist composition according to the present invention may be useful to form a pattern for an organic insulator of a liquid crystal display, metal patterning, a bump, hole drilling and UV overcoat since it has good basic physical properties such as UV transmittance, film retention, pattern stability, chemical resistance and so on, as well as an excellent heat resistance.

6 Claims, No Drawings

POSITIVE PHOTORESIST COMPOSITION

CROSS REFERENCE TO RELATED APPLICATION

This application is a National Stage Application of International Application No. PCT/KR2005/004434, filed on Dec. 21, 2005, the entirety of which is expressly incorporated by reference herein.

FIELD OF THE INVENTION

The present invention relates to a positive photoresist composition used for a liquid crystal display, and more specifically to a positive photoresist composition capable of being developed by an alkaline developing solution to form a pattern in forming an organic insulator of a liquid crystal display such as a thin film transistor-liquid crystal display (TFT-LCD), metal patterning, a bump, hole drilling, UV overcoat and so on.

BACKGROUND OF THE INVENTION

Generally, photoactive compounds has been used to form a pattern used for an organic insulator of a liquid crystal display, metal patterning, a bump, hole drilling, UV overcoat and so on. Photosensitive resin used for a process of forming such a pattern requires materials having a very excellent heat resistance in addition to basic physical properties such as uniformity, transmittance and so on.

Recently, acrylic photosensitive resins have been used as the binder resin in the photoresist composition used for forming a pattern of an organic insulator of a liquid crystal display, and the acrylic photosensitive resin exhibited a high transmittance of at least 90% at a visible range in a process at 220° C. or less, while it had a poor heat stability in a hot process at 220° C. or more. Accordingly, some of the resin tends to be decomposed by heat treatment, thereby reducing its transmittance in the visible range. Also, the acrylic photosensitive resin has various problems that the liquid crystal is contaminated by components decomposed during the hot process, and therefore has a reduced adhesion to metals and inorganic materials, etc.

SUMMARY OF THE INVENTION

Accordingly, the present invention is designed to solve the problems of the prior art, and therefore it is an object of the present invention to provide a positive photoresist composition capable being developed in an aqueous developing solution, which may be effectively used for forming an organic insulator of a liquid crystal display, metal patterning, a bump, hole drilling and UV overcoat since it has good basic physical properties such as UV transmittance, film retention, pattern stability, chemical resistance and so on, as well as an excellent heat resistance.

In order to accomplish the above object, the present invention provides a positive photoresist composition including 3 to 50% by weights of a binder resin selected from the group consisting of a resin having the structure of the following Chemical Formula 1, a resin having the structure of the following Chemical Formula 2, and their mixture; 2 to 40% by weights of a photoactive compound and 10 to 94% by weights of an organic solvent:

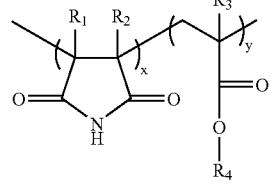

Chemical Formula 1 wherein, $R_1$, $R_2$ and $R_3$ are each independently H or methyl, $R_4$ is an alkyl or cycloalkyl group having 1 to 10 carbon atoms which contains an epoxy group, x and y represent a mole ratio of the repeating units, wherein x is 0.02 to 0.80 and y is 0.20 to 0.98, provided that the binder resin of said Chemical Formula 1 may be a random copolymer which is not limited to a given order of the repeating unit.

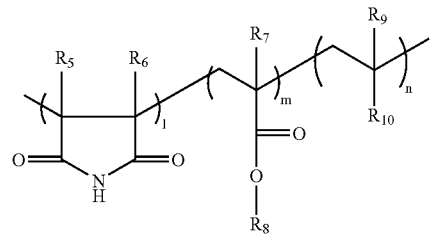

Chemical Formula 2 wherein, $R_5$, $R_6$, $R_7$ and $R_9$ are each independently H or methyl, $R_8$ is an alkyl or cycloalkyl group having 1 to 10 carbon atoms which contains an epoxy group, $R_{10}$ is at least one selected from the group consisting of carboxylic acid, alkoxycarbonyl and aromatic compound which have 1 to 14 carbon atoms, l, m and n are each a mole ratio of the repeating units, wherein l is 0.02 to 0.70, m is 0.05 to 0.60, and n is 0.01 to 0.60, provided that the binder resin of said Chemical Formula 2 may be a random copolymer which is not limited to a given order of the repeating unit.

In the positive photoresist composition according to the present invention, the binder resin having the structures of said Chemical Formulas 1 and 2 may not be decomposed in the hot process at 220° C. or more due to its excellent heat resistance, thereby minimizing contamination of a liquid crystal and maintaining a high transmittance after hardening at a high temperature. Also, the positive photoresist composition has advantages that it has an excellent aqueous alkaline developing property of the photoresist and a superior storage stability at room temperature since it includes maleimide group having a low acidity instead of acrylic acid as a functional group required for aqueous alkaline development.

In Chemical Formulas 1 and 2, $R_4$ and $R_8$ are functional groups containing epoxy group, and includes glycidyl, 3,4-epoxybutyl, 2,3-epoxycyclohexyl, 3,4-epoxycyclohexyl, 2-glycidyloxy-1-propyl, 3-methyloxetane-3-methyl, 3-ethyloxetane-3-methyl, 6,7-epoxyheptyl and so on. In Chemical Formula 2, an example of $R_{10}$ may be carboxylic acid, methoxycarbonyl, ethoxycarbonyl, propoxycarbonyl, isopropoxycarbonyl, butoxycarbonyl, t-butoxycarbonyl, pentoxycarbonyl, hexyloxycarbonyl, cyclohexyloxycarbonyl, octyloxycarbonyl, decyloxycarbonyl, dodecyloxycarbonyl, tetradecyloxycarbonyl, adamantyloxycarbonyl, 2-methyladamantyloxycarbonyl, γ-butyrolactoneoxycarbonyl, dicyclopentanyloxycarbonyl, dicyclopentenyloxycarbonyl, dicyclopentanyl-1-ethyloxycarbonyl, dicyclopentenyl-1-ethyloxycarbonyl, isobornyloxycarbonyl, hydroxyethyloxycarbonyl, dimethylaminoethyloxycarbonyl, phenyl, benzyloxycarbonyl, 4-hydroxyphenyl, 4-acetoxyphenyl, methoxy, ethoxy, phenyloxy and so on.

Meanwhile, the repeating unit having $R_{10}$ may be introduced into the resin by copolymerizing at least one selected from the group consisting of (meth)acrylic acid, methyl (meth)acrylate, ethyl(meth)acrylate, propyl(meth)acrylate, isopropyl(meth)acrylate, butyl(meth)acrylate, t-butyl(meth)acrylate, pentyl(meth)acrylate, hexyl(meth)acrylate, cyclohexyl(meth)acrylate, octyl(meth)acrylate, decyl(meth)acrylate, dodecyl(meth)acrylate, tetradecyl(meth)acrylate, adamantyl(meth)acrylate, 2-methyladamantyl(meth)acrylate, γ-butyrolactone(meth)acrylate, dicyclopentanyl(meth)acrylate, dicyclopentenyl(meth)acrylate, dicyclopentanyl-1-ethyl(meth)acrylate, dicyclopentenyl-1-ethyl(meth)acrylate, isobornyl(meth)acrylate, hydroxyethyl(meth)acrylate, dimethylaminoethyl(meth)acrylate, (α-methyl)styrene, benzyl (meth)acrylate, (α-methyl)hydroxystyrene, (α-methyl)acetoxystyrene, methylvinylether, ethylvinylether, phenylvinylether and so on.

It is desirable that the binder resins of said Chemical Formulas 1 and 2 are random copolymers which are not limited to a given order of the repeating unit, and the resins may be used as a mixture in which kinds of $R_1$ to $R_{10}$ are changed in the range described above.

It is preferred that the binder resins having the structures of said Chemical Formulas 1 and 2 have an average molecular weight of 2,000 to 300,000 and a polydispersity of 1.0 to 10.0, and more preferably an average molecular weight of 4,000 to 100,000 and a polydispersity of 1.5 to 3.0.

Also, the positive photoresist composition of the present invention includes a photoactive compound. The photoactive compound may, for example, include the conventional photoactive compounds having a structure in which a group naphthoquinone-1,2-diazide-5-sulfonic acid ester or naphthoquinone-1,2-diazide-4-sulfonic acid ester is substituted with a ballast having 1 to 6 hydroxyl groups. More specifically, the photoactive compound may include the conventional photoactive compounds having a structure in which a group naphthoquinone-1,2-diazide-5-sulfonic acid ester or naphthoquinone-1,2-diazide-4-sulfonic acid ester is substituted with at least one ballast selected from the group consisting of at least one selected from the group consisting of 2,2',3,4,4'-pentahydroxybenzophenone, 2,2',3,4,4',5-hexahydroxybenzophenone, 2,2',3,4,4'-pentahydroxydiphenylpropane, 2,2',3,4,4',5-hexahydroxydiphenylpropane, 2,3,4-trihydroxybenzophenone, 2,3,4-trihydroxyacetophenone, 2,3,4-trihydroxyphenylhexylketone, 2,4,4'-trihydroxybenzophenone, 2,4,6-trihydroxybenzophenone, 2,3,4-trihydroxy-2'-methylbenzophenone, 2,3,4,4'-tetrahydroxydiphenylmethane, 3,7,3',4'-tetrahydroxyflavon, 2,2',4,4'-tetrahydroxybenzophenone, 2,3,4,4'-tetrahydroxybenzophenone, phenol, bisphenol-A, 4,4'-[1-[4-[1-(4-hydroxyphenyl)-1-methylethyl]phenyl]-ethylidene] bisphenol, tris(4-trihydroxyphenyl)methane, tris(4-trihydroxyphenyl)-1,1,1-ethane, 4,4',4''-ethylidenetris(2-methylphenol), bis(4-hydroxyphenyl) methylphenylmethane, 1,1,4-tris(4-hydroxyphenyl) cyclohexane, 6,6',7,7'-tetrahydroxy-4,4,4',4'-tetramethyl-2, 2'-spirobichroman, 5,5',6,6'-tetrahydroxy-3,3,3',3'-tetramethyl-1,1'-spirobiindane and so on.

In order to enhance transparency and optimize developing characteristics of the photoresist, the content of such a photoactive compound is suitably used at an amount of 2 to 40% by weights, based on the total weight of the composition.

Also, a silicon-based compound containing epoxy or amine group may be further added as an adhesive auxiliary to the positive photoresist composition of the present invention, if necessary. The silicon-based compound may improve adhesion between ITO electrode and the positive photoresist composition, and heat resistance after hardening. The silicon-based compound containing epoxy or amine group includes (3-glycidoxypropyl)trimethoxysilane, (3-glycidoxypropyl)triethoxysilane, (3-glycidoxypropyl)methyldimethoxysilane, (3-glycidoxypropyl)methyldiethoxysilane, (3-glycidoxypropyl)dimethylmethoxysilane, (3-glycidoxypropyl)dimethylethoxysilane, 3,4-epoxybutyltrimethoxysilane, 3,4-epoxybutyltriethoxysilane, 2-(3,4-epoxycyclohexyl)ethyltrimethoxysilane, 2-(3,4-epoxycyclohexyl)ethyltriethoxysilane, aminopropyltrimethoxy silane and so on, and they may be used alone or in combination thereof. The preferred content of the silicon-based compound is 0.0001 to 3% by weight.

Additionally, compatible additives such as photosensitizers, thermal polymerization inhibitors, defoaming agents, and leveling agents may be added to the positive photoresist composition of the present invention, if necessary.

The positive photoresist composition of the present invention forms a pattern for an organic insulator of a liquid crystal display by adding a solvent to spin-coat the solvent on a substrate, irradiating UV ray using a mask, and then developing the spin-coated substrate with an aqueous alkaline developing solution. The solvent preferably has a content of 10 to 95% by weight, and is added so that the positive photoresist composition of the present invention can generally have a viscosity of 1 to 50 cps. The solvent is dissolved by adding and mixing a binder resin, a photoactive compound and other additives, and used for obtaining a transparent thin film having an excellent coating property. Considering compatibility with the binder resin, the photoactive compound and other compounds, the solvent includes at least one selected from the group consisting of ethyl acetate, butyl acetate, diethylene glycol dimethyl ether, diethylene glycol dimethyl ethyl ether, dipropyleneglycoldimethylether, methylmethoxy propionate, ethylethoxy propionate (EEP), ethyllactate, propylene glycol methyl etheracetate (PGMEA), propylene glycol methyl ether, propylene glycol propyl ether, methylcellosolveacetate, ethylcellosolveacetate, diethylene glycol methyl acetate, diethylene glycol ethyl acetate, acetone, methyl isobutyl ketone, cyclohexanone, dimethylformamide (DMF), N,N-dimethylacetamide (DMAc), N-methyl-2-pyrrolidone(NMP), γ-butyrolactone, diethylether, ethylene glycol dimethyl ether, diglyme, tetrahydrofuran (THF), methanol, ethanol, propanol, isopropanol, methylcellosolve, ethylcellosolve, diethylene glycol methyl ether, diethylene glycol ethyl ether, dipropylene glycol methyl ether, toluene, xylene, hexane, heptane and octane, and they may be used alone or in combination thereof.

Best Mode

Hereinafter, the present invention will be described in detail with reference to preferred embodiments and comparative embodiments. However, it should be understood that the detailed description and specific examples, while indicating preferred embodiments of the invention, are given by way of illustration only, since various changes and modifications within the spirit and scope of the invention will become apparent to those skilled in the art from this detailed description.

EMBODIMENTS 1 TO 13

According to the components and contents of the following Tables 1 and 2, a binder resin, a solvent, a photoactive compound, an adhesive auxiliary and a leveling agent were sequentially added to a reactor provided with a UV filter and a stirrer, and then stirred at room temperature to obtain a positive photoresist composition, which has a viscosity of approximately 20 cps.

Binder resin: 20% by weight
Solvent: Balance
Photoactive compound: 8% by weight
Adhesive auxiliary: 0.1% by weight
Leveling agent (FC-430 from the company 3M): 0.3% by weight

TABLE 1

| Embodiment | Binder resin | Photoactive compound | Adhesive auxiliary | Leveling agent | Solvent |
|---|---|---|---|---|---|
| 1 | In Chemistry FIG. 1, $R_1 = R_2$ = hydrogen, $R_3$ = methyl, $R_4$ = glycidyl, x = 0.4, y = 0.6 | Substituent 4,4'-[1-[4-[1-(4-hydroxyphenyl)-1-methylethyl]phenyl]ethylidene]bisphenol-naphthoquinone-1,2-diazide-5-sulfonic acid ester | APTMS | FC-430 | PGMEA |
| 2 | In Chemistry FIG. 1, $R_1 = R_2$ = hydrogen, $R_3$ = methyl, $R_4$ = epoxybutyl, x = 0.3, y = 0.7 | Substituent 2,2',3,4,4'-pentahydroxydiphenylpropane-naphthoquinone-1,2-diazide-5-sulfonic acid ester | | | |
| 3 | In Chemistry FIG. 1, $R_1 = R_2 = R_3$ = methyl, $R_4$ = glycidyl, x = 0.3, y = 0.7 | Substituent naphthoquinone-1,2-diazide-5-sulfonic acid ester of 4,4'-[1-[4-[1-(4-hydroxyphenyl)-1-methylethyl]phenyl]ethylidene]bisphenol | | | |
| 4 | In Chemistry FIG. 1, $R_1 = R_2$ = hydrogen, $R_3$ = methyl, $R_4$ = 2,3-epoxycyclohexyl, x = 0.4, y = 0.6 | Substituent naphthoquinone-1,2-diazide-5-sulfonic acid ester of 2,3,4,4'-tetrahydroxyphenylmethane | | | |
| 5 | In Chemistry FIG. 2, $R_5 = R_6$ = hydrogen, $R_7 = R_9$ = methyl, $R_8$ = glycidyl, $R_{10}$ = methoxycarbonyl, l = 0.3, m = 0.3, n = 0.4 | Substituent naphthoquinone-1,2-diazide-5-sulfonic acid ester of bisphenol A | | | |
| 6 | In Chemistry FIG. 2, $R_5 = R_6 = R_9$ = hydrogen, $R_7$ = methyl, $R_8$ = glycidyl, $R_{10}$ = phenyl, l = 0.3, m = 0.2, n = 0.5 | Substituent naphthoquinone-1,2-diazide-5-sulfonic acid ester of 4,4'-[1-[4-[1-(4-hydroxyphenyl)-1-methylethyl]phenyl]ethylidene]bisphenol | | | |
| 7 | In Chemistry FIG. 2, $R_5 = R_6$ = hydrogen, $R_7 = R_9$ = methyl, $R_9$ = 2,3-epoxycybutyl, $R_{10}$ = benzyloxycarbonyl, l = 0.3, m = 0.3, n = 0.4 | Substituent naphthoquinone-1,2-diazide-5-sulfonic acid ester of 4,4',4''-trihydroxyphenylmethane | | | |

TABLE 2

| Embodiment | Binder resin | Photoactive compound | Adhesive auxiliary | Leveling agent | Solvent |
|---|---|---|---|---|---|
| 8 | In Chemistry FIG. 2, $R_5 = R_6$ = hydrogen, $R_7 = R_9$ = methyl, $R_8$ = 3-methyloxetane-3-methyl, $R_{10}$ = cyclohexyloxycarbonyl, l = 0.25, m = 0.35, n = 0.4 | Substituent naphthoquinone-1,2-diazide-5-sulfonic acid ester of 4,4',4''-ethylidenetris(2-methylphenol) | APTMS | FC-430 | PGMEA |
| 9 | In Chemistry FIG. 2, $R_5 = R_6 = R_7 = R_9$ = methyl, $R_8$ = glycidyl, $R_{10}$ = t-butyloxycarbonyl, l = 0.4, m = 0.3, n = 0.3 | Substituent naphthoquinone-1,2-diazide-5-sulfonic acid ester of bis-(4-hydroxyphenyl)methylphenylmethane, 1,1,4-tris(4-hydroxyphenyl)cyclohexane | | | |
| 10 | In Chemistry FIG. 2, $R_5 = R_6$ = hydrogen, $R_7 = R_9$ = methyl, $R_8$ = glycidyl, $R_{10}$ = γ-butyrolactoneoxycarbonyl, l = 0.3, m = 0.3, n = 0.4 | Substituent naphthoquinone-1,2-diazide-5-sulfonic acid ester of 5,5',6,6'-tetrahydroxy-3,3,3',3'-tetramethyl-1,1'-spirobiindane | | | |
| 11 | In Chemistry FIG. 2, $R_5 = R_6$ = hydrogen, $R_7 = R_9$ = methyl, $R_8$ = 2,3-epoxycyclohexyl, $R_{10}$ = dicyclopentanyloxycarbonyl, l = 0.3, m = 0.3, n = 0.4 | Substituent naphthoquinone-1,2-diazide-5-sulfonic acid ester of 6,6',7,7'-tetrahydroxy-4,4,4',4'-tetramethyl-2,2'-spirobichroman | | | |

TABLE 2-continued

| Embodiment | Binder resin | Photoactive compound | Adhesive auxiliary | Leveling agent | Solvent |
|---|---|---|---|---|---|
| 12 | In Chemistry FIG. 2, $R_5 = R_6$ = hydrogen, $R_7 = R_9$ = methyl, $R_8$ = 3-methyloxetane-3-methyl, $R_{10}$ = decyloxycarbonyl, $l = 0.4, m = 0.4, n = 0.2$ | Substituent naphthoquinone-1,2-diazide-4-sulfonic acid ester of 4,4'-[1-[4-[1-(4-hydroxyphenyl)-1-methylethyl]phenyl]ethylidene]bisphenol | | | |
| 13 | Mixture of binder resin of Embodiment 1 and binder resin of Embodiment 10 at a mixing ratio of 1:1 | Substituent naphthoquinone-1,2-diazide-5-sulfonic acid ester of 1,1,4-tris(4-hydroxyphenyl)cyclohexane | | | |

In the Tables 1 and 2, APTMS represents (3-aminopropyl-trimethoxysilane), and PGMEA represents propylene glycol methyl etheracetate. The binder resins of Chemical Formulas 1 and 2 have an average molecular weight of approximately 10,000 and a polydispersity of 2.1.

COMPARATIVE EMBODIMENTS 1 AND 2

Positive photoresist composition were prepared with the same contents in the same manner, except that, according to the components and contents of the following Table 3, a binder resin having the structure of the following Chemical Formula 3 was used instead of the binder resin of said Embodiment 1.

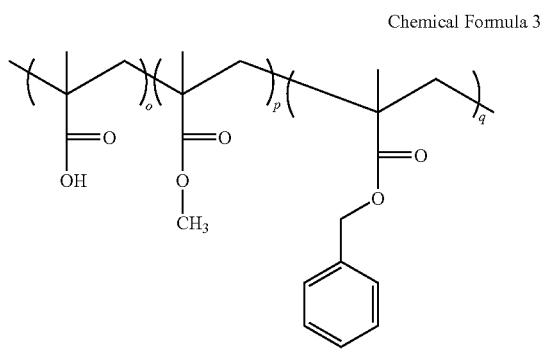

Chemical Formula 3

TABLE 3

| Comparative embodiment | Binder resin of Chemical Formula 3 | Photoactive compound | Adhesive auxiliary | Leveling agent | Solvent |
|---|---|---|---|---|---|
| 1 | o = 0.3, p = 0.2, q = 0.5 | THPNS | 3-aminopropyl-trimethoxysilane | FC-430 | PGMEA (to 100) |
| 2 | o = 0.3, p = 0.3, q = 0.4 | THPNS | | | |

In said Table 3, THPNS represents a substituent naphthoquinone-1,2-diazide-5-sulfonic acid ester of 4,4',4''-trihydroxyphenylmethane. In said Table 3, the binder resins of Chemical Formula 3 have an average molecular weight of approximately 10,000, a polydispersity of 2.3, and an acid value of 100.

In table 3, the binder resins of the general formula 4 have 20,000 of average molecular weight, 2.5 of polydispersity, and 100 of acid value.

The evaluations of the positive photoresist composition according to the embodiments and the comparative examples were performed on a substrate such as a silicon wafer or glass substrate. Thermal property, transmittance (T%, at 400 nm), uniformity, film retention and pattern formation of the photoresist composition were tested as below. The results are listed in the following Tables 4 and 5.

(1) Thermal Property

The positive resist composition was applied on a substrate at 800 rpm for 8 seconds using a spin coater, prebaked at 100° C. for 1 minute, exposed at 435 nm for 15 seconds, and the postbaked at 220° C. for 30 minutes to form a photoresist layer. Then, the resultant photoresist layer was put into an autoclave, and ripened at 100° C. for 1 hour. The test piece ripened in autoclave was scratched with a Cross Hatch Cutter to uncover the substrate, bonded with adhesive tape, and then taken off. If 80 out of 100 cells were not taken off from the substrate, we denoted that it was "good", otherwise "bad".

(2) UV Transmittance

The positive resist composition was applied on a substrate with a spin coater at 800 rpm for 8 seconds, prebaked at 100° C. for 1 minute, spray-developed using 2.38% TMAH solution for 60 seconds, rinsed with DI water, blown with compressed air, photo bleached for 5 minutes in a 435-nm exposure machine, and postbaked at 240° C. for 30 minutes to form a photoresist layer, which has a thickness of about 3.5~4.0 µm. The UV transmittance at 400 nm was measured for the photoresist layer using a UV-vis measuring system.

(3) Film Retention

The positive resist composition was spin-coated on a substrate. The thickness ratio (%) between layers formed by prebaking at 200° C. for 30 minutes and postbaking at 240° C. for 30 minutes was measured.

(4) Pattern Formation

The silicon wafer forming a positive photoresist pattern was taken along axial direction of a hole pattern, and observed from the sectional direction of the pattern with an electron microscope. If the angle between a pattern sidewall and the substrate was more than 55° and the thickness of the layer was not reduced, we denoted that it is "good", while if the thickness of the layer was reduced, we denoted that it is "TR (Thickness Reduction)".

(5) Chemical Resistance

The positive photoresist composition was applied on a substrate with a spin coater, and prebaked and postbaked to form a photoresist layer. The formed photoresist layer was immersed in stripper and etchant solution at 40° C. for 10 minutes. Then, any changes of the transmittance and the thickness were examined for the photoresist layer. If the transmittance and the thickness were changed, we denoted that it was "good", otherwise "bad".

TABLE 4

| Embodiment | Adhesion | UV Transmittance (%), (@400 nm) | Film Retention (%) | Pattern formation | Chemical resistance |
|---|---|---|---|---|---|
| 1 | Good | 95 | 94 | Good | Good |
| 2 | Good | 96 | 94 | Good | Good |
| 3 | Good | 96 | 95 | Good | Good |
| 4 | Good | 95 | 94 | Good | Good |
| 5 | Good | 94 | 95 | Good | Good |
| 6 | Good | 95 | 97 | Good | Good |
| 7 | Good | 94 | 96 | Good | Good |
| 8 | Good | 93 | 96 | Good | Good |
| 9 | Good | 95 | 96 | Good | Good |
| 10 | Good | 96 | 97 | Good | Good |
| 11 | Good | 95 | 97 | Good | Good |
| 12 | Good | 95 | 95 | Good | Good |
| 13 | Good | 94 | 95 | Good | Good |

TABLE 5

| Comparative embodiment | Adhesion | UV Transmittance (%), (@400 nm) | Film Retention (%) | Pattern formation | Chemical resistance |
|---|---|---|---|---|---|
| 1 | Bad | 89 | 87 | TR | Bad |
| 2 | Bad | 88 | 85 | TR | Bad |

As listed in Tables 4 and 5, it was seen that the positive photoresist composition of the present invention exhibited the very excellent properties such as the adhesion to metals and inorganic materials, the UV transmittance, the film retention, the uniformity and the pattern stability, as well as the excellent heat resistance unlike the conventional resist compositions.

INDUSTRIAL APPLICABILITY

As described above, the positive photoresist composition according to the present invention exhibited the very good uniformity and pattern stability, as well as the excellent heat resistance. The positive photoresist composition may also have the excellent transmittance and control the brightness of a backlight, thereby enhancing battery efficiency and minimizing the effect on chromaticity difference. Moreover, the positive photoresist composition of the present invention can easily form a photoresist having desired physical properties by changing the structure and the composition ratio of a binder resin within the scope of the present invention.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

The invention claimed is:

1. A positive photoresist composition, comprising:
   3 to 50% by weights of a binder resin selected from the group consisting of a resin having the structure of a Chemical Formula 1, a resin having the structure of a Chemical Formula 2, and their mixture;
   2 to 40% by weights of a photoactive compound; and
   10 to 94% by weights of an organic solvent:
   wherein the Chemical Formula 1 has the structure:

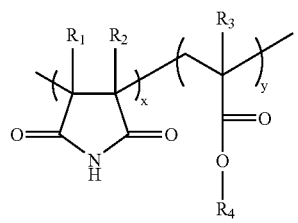

wherein, $R_1$, $R_2$ and $R_3$ are each independently H or methyl,
$R_4$ is an alkyl or cycloalkyl group having 1 to 10 carbon atoms which contains an epoxy group, and
x and y represent a mole ratio of the repeating units, wherein x is 0.02 to 0.80 and y is 0.20 to 0.98, provided that the binder resin of said Chemical Formula 1 may be a random copolymer which is not limited to a given order of the repeating unit; and
wherein the Chemical Formula 2 has the structure:

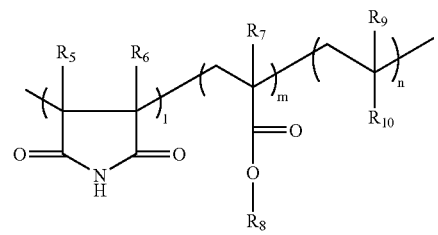

wherein, $R_5$, $R_6$, $R_7$ and $R_9$ are each independently H or methyl;
$R_8$ is an alkyl or cycloalkyl group having 1 to 10 carbon atoms which contains an epoxy group;
$R_{10}$ is at least one selected from the group consisting of carboxylic acid, alkoxycarbonyl and aromatic compound which have 1 to 14 carbon atoms;
l, m and n are each a mole ratio of the repeating units, wherein l is 0.02 to 0.70, m is 0.05 to 0.60, and n is 0.01 to 0.60, provided that the binder resin of said Chemical Formula 2 may be a random copolymer which is not limited to a given order of the repeating unit.

2. The positive photoresist composition according to claim 1, wherein the binder resin having the structure of Chemical Formula 1 has an average molecular weight of 2,000 to 300,000 and a polydispersity of 1.0 to 10.0.

3. The positive photoresist composition according to claim 1, wherein the organic solvent comprises at least one selected from the group consisting of ethyl acetate, butyl acetate, diethylene glycol dimethyl ether, diethylene glycol dimethyl ethyl ether, methylmethoxy propionate, ethylethoxy propionate (EEP), ethyllactate, propylene glycol methyl etheracetate (PGMEA), propylene glycol methyl ether, propylene glycol propyl ether, methylcellosolveacetate, ethylcellosolveacetate, diethylene glycol methyl acetate, diethylene glycol ethyl acetate, acetone, methyl isobutyl ketone, cyclohexanone, dimethylformamide (DMF), N,N-dimethylacetamide (DMAc), N-methyl-2-pyrrolidone (NMP), γ-butyrolactone, diethylether, ethylene glycol dimethyl ether, diglyme (Diglyme), tetrahydrofuran (THF), methanol, ethanol, propanol, isopropanol, methylcellosolve, ethylcellosolve, diethylene glycol methyl ether, diethylene glycol ethyl ether, dipropylene glycol methyl ether, toluene, xylene, hexane, heptane and octane.

4. The positive photoresist composition according to claim 1, wherein the photoactive compound is a compound having a structure in which a group naphthoquinone-1,2-diazide-5-sulfonic acid ester or naphthoquinone-1,2-diazide-4-sulfonic acid ester is substituted with a ballast having 1 to 6 hydroxyl groups.

5. The positive photoresist composition according to claim 1, further comprising 0.0001 to 3% by weights of a silicon-based compound containing epoxy or amine group.

6. The positive photoresist composition according to claim 5, wherein the silicon-based compound containing epoxy or amine group comprises at least one selected from the group consisting of (3-glycidoxypropyl)trimethoxysilane, (3-glycidoxypropyl)triethoxysilane, (3-glycidoxypropyl)methyldimethoxysilane, (3-glycidoxypropyl)methyldiethoxysilane, (3-glycidoxypropyl)dimethylmethoxysilane, (3-glycidoxypropyl)dimethylethoxysilane, 3,4-epoxybutyltrimethoxysilane, 3,4-epoxybutyltriethoxysilane, 2-(3,4-epoxycyclohexyl)ethyltrimethoxysilane, 2-(3,4-epoxycyclohexyl)ethyltriethoxysilane and aminopropyl trimethoxysilane.

* * * * *